United States Patent [19]

Raviglione et al.

[11] Patent Number: 5,307,290
[45] Date of Patent: Apr. 26, 1994

[54] SYSTEM FOR THE AUTOMATIC TESTING, PREFERABLY ON A BENCH, OF ELECTRONIC CONTROL SYSTEMS WHICH ARE INTENDED TO BE FITTED IN VEHICLES

[75] Inventors: Cesare Raviglione; Antonino Gallo; Vincenzo Di Lago, all of Turin, Italy

[73] Assignee: Fiat Auto S.p.A., Turin, Italy

[21] Appl. No.: 95,312

[22] Filed: Jul. 21, 1993

Related U.S. Application Data

[63] Continuation of Ser. No. 759,184, Sep. 10, 1991, abandoned, which is a continuation of Ser. No. 392,108, Aug. 9, 1989, abandoned.

[30] Foreign Application Priority Data

Oct. 18, 1988 [IT] Italy ............................. 67932 A/88

[51] Int. Cl.$^5$ ............................................. G06F 15/20
[52] U.S. Cl. ............................ 364/551.01; 73/117.1
[58] Field of Search ............. 364/578, 424.03, 424.04, 364/481, 483, 551.01, 579, 580, 550; 324/73.1, 383; 73/117.1, 117.2, 117.3, 118.1, 856.6, 116

[56] References Cited

U.S. PATENT DOCUMENTS

| | | | |
|---|---|---|---|
| 3,630,076 | 12/1971 | Staudt | 73/117.3 |
| 3,789,658 | 2/1974 | Olsen | 73/117.3 |
| 3,890,836 | 6/1975 | McKenzie et al. | 73/168 |
| 4,300,205 | 11/1981 | Tansuwan | 364/578 |
| 4,325,251 | 4/1982 | Kanegae | 73/117.3 |
| 4,402,055 | 8/1983 | Lloyd et al. | 364/579 |
| 4,425,791 | 1/1984 | Kling | 73/117.3 |
| 4,517,839 | 5/1985 | Van Dyke | 73/866.4 |
| 4,630,224 | 12/1986 | Sollman | 364/550 |
| 4,686,628 | 10/1987 | Lee et al. | 364/481 |
| 4,694,408 | 9/1987 | Zaleski | 364/424.03 |
| 4,728,885 | 3/1988 | Desanto | 364/481 |
| 4,757,463 | 7/1988 | Ballou et al. | 73/117.2 |
| 4,839,812 | 6/1989 | Nusser et al. | 364/424.04 |
| 4,847,790 | 7/1989 | Suzuki et al. | 364/550 |
| 4,871,965 | 10/1989 | Elbert et al. | 324/73.1 |

FOREIGN PATENT DOCUMENTS

| | | |
|---|---|---|
| 0039122 | 11/1981 | European Pat. Off. . |
| 8802122 | 3/1988 | World Int. Prop. O. . |

OTHER PUBLICATIONS

"Automated Thermal Test System", *IBM Technical Disclosure Bulletin*, M. L. Buller, et al., vol. 26, No. 12, May 1984, pp. 6289-6290.

"Automobile Electronics Test Diagnostic Instrument and Communications Circuit", *IBM Technical Disclosure Bulletin*, vol. 31, No. 3, Aug. 1988, pp. 428-431.

*Primary Examiner*—Thomas G. Black
*Assistant Examiner*—Michael Zanelli
*Attorney, Agent, or Firm*—Spensley Horn Jubas & Lubitz

[57] ABSTRACT

The system includes apparatus for generating stimulation signals for application to the device being tested. The device being tested is typically an electronic control unit for an automotive vehicle. The system also includes apparatus for decoding and analyzing the signals output by the device being tested as a result of the application of the stimulation signals.

8 Claims, 3 Drawing Sheets

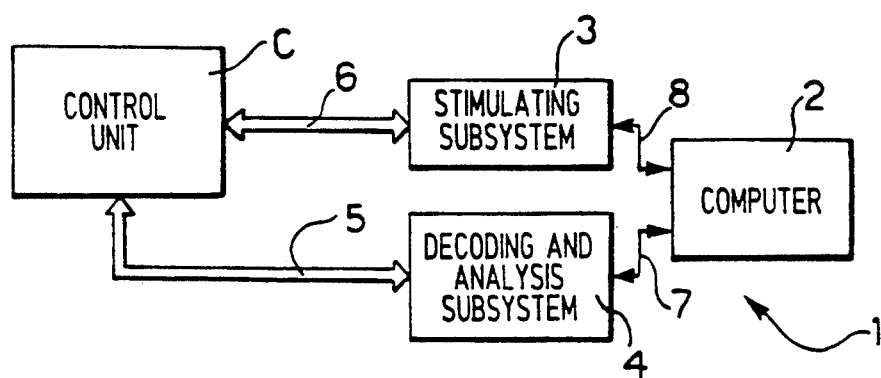
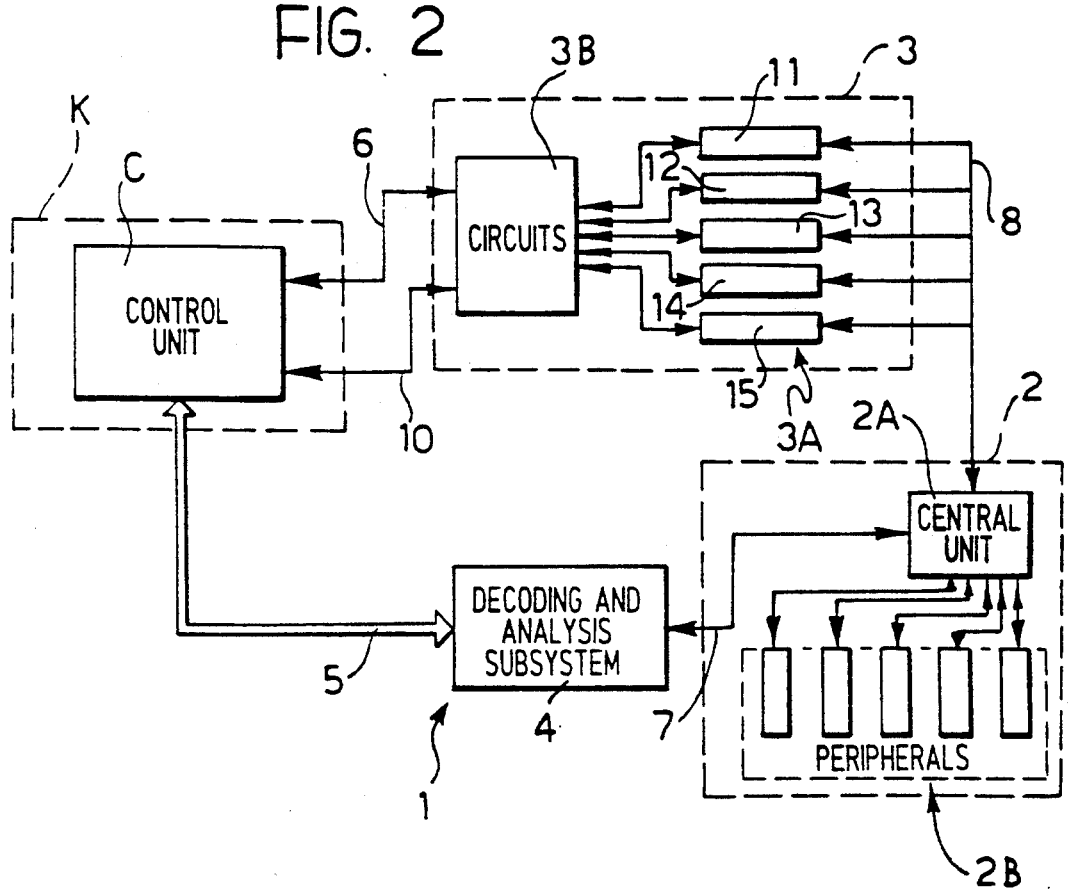

ative testing system must offer the possibility of preparing functional tests for a generic control unit in the laboratory without the need necessarily to carry out tests on the vehicle, thus avoiding the following disadvantages:

SYSTEM FOR THE AUTOMATIC TESTING, PREFERABLY ON A BENCH, OF ELECTRONIC CONTROL SYSTEMS WHICH ARE INTENDED TO BE FITTED IN VEHICLES

This is a file wrapper continuation of application Ser. No. 07/759,184 filed on Sep. 10, 1991, which is a file wrapper continuation of application Ser. No. 07/392,108, filed on Aug. 9, 1989, now both abandoned.

BACKGROUND OF THE INVENTION

The present invention relates in general terms to testing (checking) systems used for the automatic testing of the characteristics and/or operating conditions of electrical and/or electronic circuits.

More specifically, an embodiment of the invention has been developed for possible application in the automotive sector in order to provide an automatic testing station which can stimulate electronic control units (E.C.U.s) of vehicles by simulating, during bench testing, the conditions present in vehicles in order to check whether or not they are operating correctly.

In order fully to satisfy the requirements of use, such an automatic testing system must offer the possibility of preparing functional tests for a generic control unit in the laboratory without the need necessarily to carry out tests on the vehicle, thus avoiding the following disadvantages:

- practical difficulties in preparing for the test (availability of the prototype vehicle, non-optimal operation of the prototype . . . ),
- testing which is not always exhaustive (difficulties in the generation of anomalous conditions, possibility of damaging parts of the vehicle involved in the test), and
- risks to the testers in promoting the malfunctioning of devices of the vehicle.

The advantages to be provided are therefore:
- the ability to test a generic control unit rapidly,
- the ability to reproduce the tests in a predetermined sequence,
- the ability to carry out tests on control units under different climatic conditions by the modification of temperature and humidity, and
- the immediate availability of documentation relating to the results of the tests carried out.

An object of the present invention is therefore to provide a testing system which achieves the above advantages while avoiding the disadvantages described above.

SUMMARY OF THE DISCLOSURE

According to an embodiment of the present invention, this object is achieved by a system having the characteristics given in the claims which follow.

In brief, as regards the arrangement of its circuits (hardware), the system according to an embodiment of the invention can be divided into two functionally-interconnected subsystems, that is:
- a subsystem for stimulating the control unit under test, and
- a subsystem for decoding and analysing messages transmitted by the control unit under test through a serial diagnostic channel.

The two subsystems are controlled by a central computer dedicated to the organisation, synchronising and checking of the tests generated for the bench stimulation of the electronic control units.

The specification of the tests to be carried out is defined by the operator by means of a high-level software interface.

The instrumentation necessary for making up the stimulation subsystem is preferably selected on the basis of signals characterised during the feasibility studies, which may be classified into:
- repetitive analog signals of arbitrary form which are variable in frequency and in amplitude (for example signals indicative of the passage through top dead center, of the phase of the engine etc . . . ),
- non-repetitive analog signals of arbitrary form, which are variable in amplitude and in frequency (for example signals indicative of the vacuum in the intake manifold, of the position of the carburettor throttle valve, . . . ),
- on/off signals which are variable in amplitude or in frequency (for example steering sensor, accelerometer . . . ), and
- signals which simulate resistive transducers (for example NTC or PTC transducers . . . ).

The result of the test can preferably be determined by the acquisition of the messages which the central control unit sends to the decoding system.

This dialogue enables information to be exchanged between the stimulation and decoding subsystems so as to enable the events constituting the test of the control unit to be synchronised.

The software of the system according to an embodiment of the invention preferably also enables the operator to interact by means of a selection menu guided by means of function keys.

The programs are written in a high-level language and are made of open modules which allow modification and possibly additions. The procedures for testing the various control units are organised in testing sequences, each of which serves to check that individual anomalies are detected correctly.

The tests implemented can be scanned at will and their succession achieves the complete or partial testing of the control unit under test. The program provides for the production from time to time by the dedicated instrumentation of the signals necessary to stimulate the control unit during the execution of the required test and the simultaneous analysis of the information available from the diagnostic channel.

The specification of a test refers to a data base of the elemental signals necessary for the complete functioning of the control unit.

The input or output signals of the control unit are usually characterised by the following information:
- a single identification of the signal,
- the instrument which is to generate or check the signal, and
- a description of the signal, defined as the set of information necessary for the instrument to generate or check the signal correctly.

BRIEF DESCRIPTION OF THE DRAWINGS

An embodiment of the invention will now be described, purely by way of non-limiting example, with reference to the appended drawings representing respectively:

FIG. 1, the general architecture of the system according to an embodiment of the invention, FIG. 2, an enlarged detail of the architecture, FIG. 3, a possible circuit for implementing the system according to an embodiment of the invention, and FIG. 4, a diagram of the paths and switching of the signals within the circuit of FIG. 3.

DESCRIPTION OF THE PREFERRED EMBODIMENTS

Figure 3:
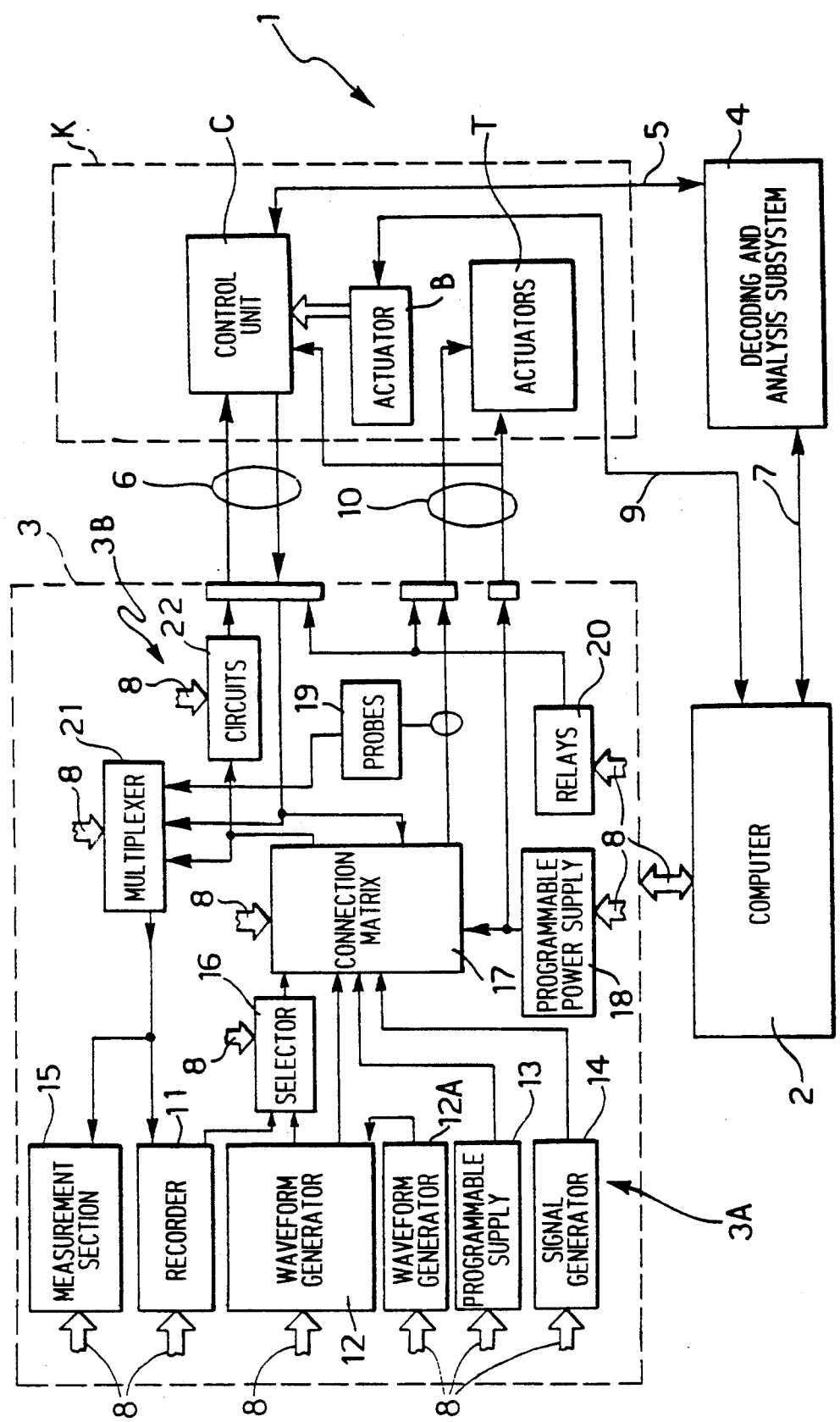

As already stated above, the system according to an embodiment of the invention, generally indicated 1 in the appended drawings, is intended to enable the automatic checking of electronic control units (E.C.U.s) which control the operation of electrical and/or electronic circuits in motor vehicles. This is achieved by means of functional tests carried out on a test bench, that is, in general, before the fitting of the control unit in the vehicle and possibly after its removal from the vehicle.

In FIGS. 1 to 4, such a control unit, which may be of any type known in the art, is generally indicated C.

The system 1 is composed essentially of a control processor or computer 2 (typically a minicomputer, or possibly an advanced microprocessor) which coordinates the operation of two subsystems constituted respectively by:

a subsystem 3 for stimulating the control unit C, and a subsystem 4 for decoding and analysing the messages transmitted by the control unit C under test.

In the embodiment currently preferred, to which the present description relates, the decoding and analysis subsystem 4, which is connected to the control unit through a serial channel 5 which acts as the diagnostic line, corresponds essentially to the solution described in the previous patent application for industrial invention NO. 87905745.3, corresponding to published PCT application WO 88/02122 (published Mar. 24, 1988) in the name of the same Applicant.

The structure and functions of the subsystem 4, which does not itself constitute a specific subject of the present invention—except as regards its connection to and dialogue with other components of the system 1—will not therefore be described in detailed herein.

Stimulation subsystem 3 functions mainly to apply signals to the control unit C during its testing on the bench, which signals reproduce, as faithfully as possible, the signals which the control unit C will receive during its operation in a motor vehicle so that the circuit integrity and operation of the control unit C can consequently be checked, even as regards to its reactions to anomalous operating situations (warning routines, etc.).

As already indicated above, the signals generated by the subsystem 3 for application to the control unit C through a communication line 6 consist essentially of:

logic signals (on/off) which are variable in amplitude and in frequency, repetitive analog signals of arbitrary form which are variable in frequency and in amplitude, non-repetitive analog signals of arbitrary form which are variable in amplitude and in frequency, and signals which simulate resistive transducers.

As regards to the communications between the control computer 2 and the subsystems 3 and 4, a standard protocol of the RS 232 C type may, for example, be used for communication with the diagnostic decoding subsystem 4 and a GP-IB bus may be used for communication with the stimulating and measuring subsystem 3.

In general, the checking (or the testing in general) of the control unit C is effected whilst it is in an air-conditioned cell K so that environmental conditions (pressure, temperature, humidity, possible vibrations, etc) prevailing in the cell K are variable selectively (according to known criteria with the use of actuators B of known type such as vacuum pumps/compressors, heating and/or cooling elements etc.).

For this purpose, the actuators B (FIG. 3) are controlled by the computer 2 through a line 9.

One or more actuators to which the control unit is functionally connected during use are indicated T. These may also be placed in the cell K and tested by means of a line 10 connected to the subsystem 3.

According to a widely-known solution, the computer 2 which controls the system is arranged, as shown schematically in FIG. 2, in the form of a central unit 2A with a plurality of associated peripherals 2B such as, for example, a video screen with a keyboard, a so-called "mouse", a printer, a graphics tablet, a device for drawing graphs ("plotter"), various external memories, etc. . .

The subsystem 3 enables input sensors to be simulated and the signals output by the electronic control unit C to control the actuators T associated therewith in normal use to be checked simultaneously.

In general terms (as shown generally in FIGS. 2 and in greater detail in FIGS. 3 to 4) the subsystem 3 consists essentially of a group of stimulation and measurement moduli generally indicated 3A, with an associated group of circuits 3B (amplifiers, adaptors, relays, multiplexers, etc.) which act as an interface for communication with the control unit C under test and the cell K in which the latter is situated through the lines 6 and 10.

The group of modules 3A thus also includes circuit elements which enable measurements to be made and, in particular, the functions of:

the simultaneous display of the input and output signals from and to the electronic control unit C, the partial or total acquisition of these signals, and the measurement of the signals generated by the control unit C.

In one possible embodiment, the group of modules 3A includes:

a multichannel magnetic recorder 11 such as, for example, a Sony KS616U recorder or the like, a waveform generator 12 which, in dependence on signals received on the bus 8 from the computer, can generate signals having sinusoidal, triangular, square, pulsed, digitally-coded waveforms or any other arbitrary wave form generated by any known method of synthesis; the generator 12 may be constituted, for example, by a bank of signal generators with digital control, such as the Hewlett-Packard generators HP3245, HP44726A and HP44724A. A further circuit 12A constituted, for example, by a wave-form generator HP44725A is associated with the latter circuit so as to generate amplitude and frequency modulation waveforms, one or more programmable supplies 13, such as a two-channel programmable supply HP6622A, a circuit 14 which simulates the resistance signals output by a resistive transducer such as an NTC or PTC transducer (negative or positive temperature coefficient transducer), and a measurement section 15, including, for example, one or more oscilloscopes (for example HP54501), one or more frequency meters (for example HP53708 and HP44715A) as well as one or more voltmeters (for example HP 44702A).

The exact way in which the modules 3A are connected to the lines 6 and 10 according to the illustrated embodiment will be described in greater detail below.

The magnetic recorder 11 is used mainly in order:

to record its input of all the signals input and output by and to the electronic control unit C, and to apply to the control unit C itself, prerecorded signals which have been synthesised (constructed) in the laboratory, or possibly detected in a motor vehicle under particular operating conditions: in this connection, the magnetic recorder 11 can cooperate with or even replace the generators of the group 12 to 14 for generating arbitrary wave forms.

The main function of the generators 12 to 14 is to produce the signals necessary to stimulate the control unit C under test. The individual components (for example the commercially available components explicitly referred to above) have resident intelligence and are therefore able to process test sequences automatically after they have been instructed and synchronised by the computer 2.

The autonomy of the generators 12 to 14 enables the computer 2 to concentrate its activities on the real-time analysis of the results of the tests taking place. In other words, in an initial operating phase of the system 1, the computer 2 instructs the various generators 12 so that they can generate the signals for stimulating the control unit C (according to a predetermined sequence). The computer 2 can then concentrate its attention on the monitoring and/or diagnostic signals, particularly those which it receives from the decoding system 4 through the line 7, whilst the intelligence resident in the circuits 12 enables them to generate the signals autonomously.

The instructions conveyed from the computer 2 to the circuits 12 to 14 (and possibly also to the recorder 11 when it is acting as a source of prerecorded signals) correspond to the instructions received in a high-level language from the operator by means of one or more interfaces.

In general the instructions may concern:

the criteria for generating the signals, that is the selection of the generator or generators to be activated, the path which the signals must follow with the assignation of the respective output line (in this connection see the detailed description, given below, of the criteria by which the lines 6 and 10 are connected), the construction of a library of signals, the selection of the signals to be detected, that is, the definition of the input line, the paths the signals must follow, the instruments 15 to be activated, the characteristics and tolerances of the expected signals, the possible composition of a library of input sinals, the description of the tests to be carried out with the selection and synchronisation of the signals which are to be generated or measured in order to execute the test, the definition of the development of the signals generated with time, the definition of the timing and manner of checking of the signals measured, the possible "filing" of the test described, with the possibility of automatic retrieval, and construction of testing sequences, possibly with the selection and combination of several tests which have already been filed.

As already stated, dialogue with the control computer can take place through any of the peripherals associated therewith (keyboard, video, tablet, mouse, hard disc, floppy disc, printer, plotter, etc.).

An input selector circuit piloted by the computer 2 through the bus 8 is indicated 16. The selector 16 (for example an HP 34503B component) enables the individual selection of the channels coming from the magnetic recorder 11, or those coming from the wave form generators and the application of the signals selected to the control unit C.

In particular the selector 16 enables the signals produced by the generators 12 to 14, the signals prerecorded in the recorder 11, or combinations thereof, to be applied to the control unit C.

Reference 17 indicates a connection matrix 17 which, still under the control of the computer 2 through the line 8, as well as supervising the switching of the signals generated in the modules 11 to 14 to the lines 6 and 10, can also act as a generator of disturbances, such as:

short-circuiting to the supply voltage (battery), short-circuiting to earth, and open circuit in all the signals coming from the modules 11 to 14 (which are intended to be transferred to the control unit C through the line 6) as well as, optionally, in the signals generated by the electronic supply unit C for the piloting of the actuators T associated therewith. The latter signals are transferred to the control unit C and the actuators T of the cell K through the line 10. For this purpose the matrix 17 may include several HP 34510B and HP34511M modules (switching of generator signals).

The use is also envisaged of a programmable power supply 18 (for example an HP 6032 component) which can simulate the supply voltage of the electronic control unit C and its actuators T. In particular, the supply 18 enables variations in this voltage to be simulated so that the electronic control unit C can be tested to check that it operates correctly when it is supplied within the limits of the range of values in which it must operate.

One or more probes, indicated at 19, are connected to the line 10 for measuring the behaviour of the current in the actuators T during the tests, enabling their operation to be checked under different working conditions.

Finally, a bank of relays or controllable electronic switches (for example an HP 44725A module) is indicated 20 and enables the various switches or deviators at the input of the electronic control unit C to be simulated so as to activate or de-activate the electronic circuitry constructed to simulate abnormalities in the actuators.

Turning now to a description of the elements which act as the interface (3B), a multiplexer (for example with 64 channels—HP 447245A and/or HP 34511B components) indicated 21 is connected to the switching matrix 17 (that is the generators 12 to 14) and to the actuators, as well as to the probes 19, and has the function of switching the signals which are travelling from and to the control unit C on the line 6 to the measurement section 15 and to the magnetic recorder 11.

Finally, a bank of amplifiers-adaptors is indicated 22 whose function is to adjust the electrical levels of the signals generated for simulating the sensors of the electronic control unit.

Figure 4:
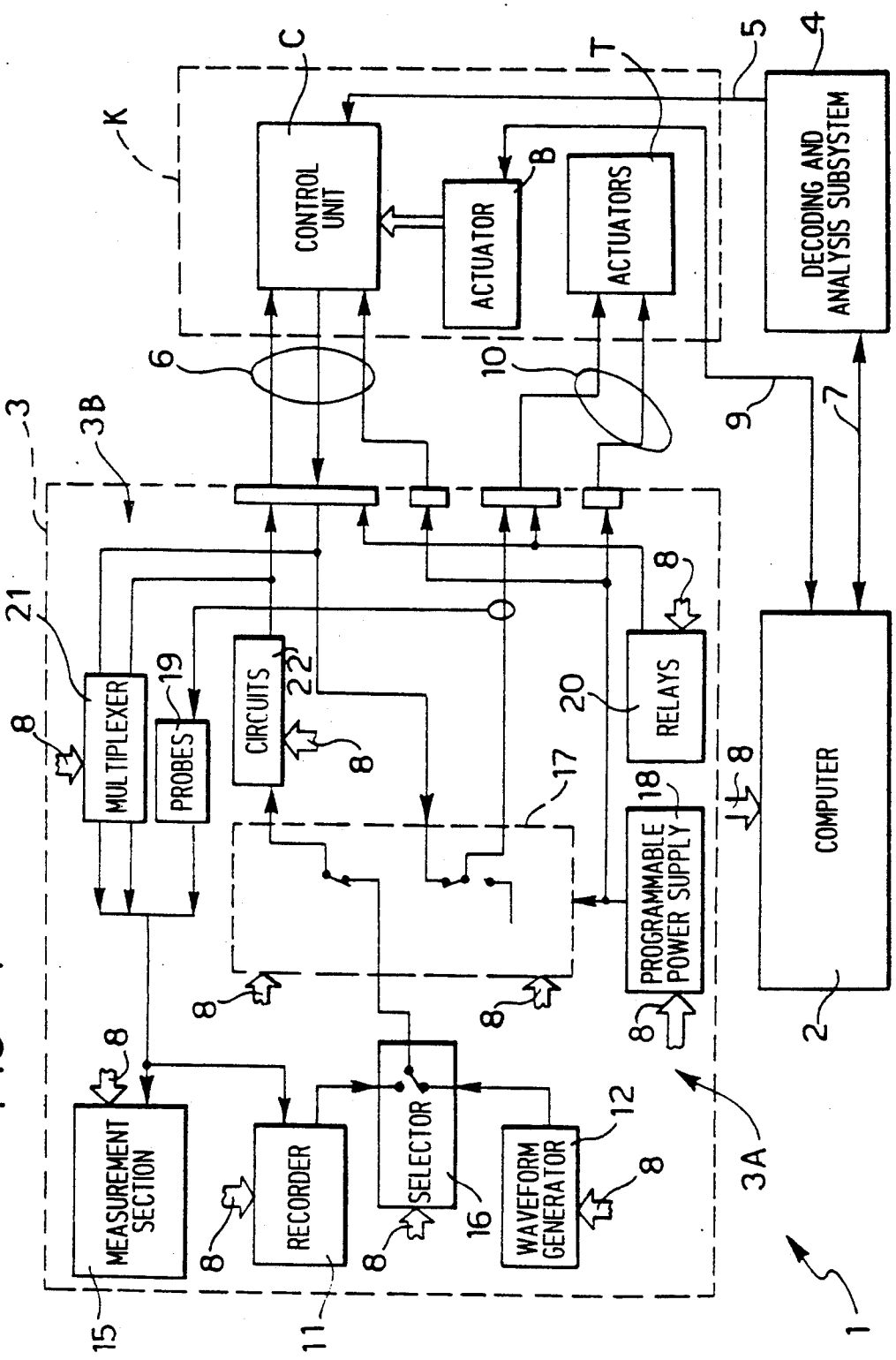

FIG. 4 indicates a typical signal path and switching diagram showing that it is possible to select a simulating signal, or a signal from the recorder or from the function generator and to simulate breakdowns (open circuits, short circuits to the battery or to earth).

We claim:

1. A system for bench testing an electronic control system for a motor vehicle in conjunction with a test bench, the system including:
   means for generating predetermined signals for stimulating the electronic control system under test;
   means for applying the predetermined stimulation signals to the electronic control system on the test bench;
   mean for decoding and analyzing the signals output by the electronic control system as a result of the application of the stimulation signals; and
   connection means for conveying the stimulation signals to the system under test, which connection means are able to apply to at least one of the stimulation signals, disturbances which correspond to at least one of the following phenomena:
   short circuiting to a battery,
   short circuiting to earth, and
   open circuit.

2. A system according to claim 1, applicable to the testing of control systems with respective associated actuators wherein the connection means can also apply said disturbances to the actuators.

3. A system for bench testing an electronic control system for a motor vehicle in conjunction with a test bench, the system including:
   means independent of the motor vehicle for generating predetermined signals for stimulating the electronic control system under test;
   means independent of the motor vehicle for applying the predetermined stimulation signals tot eh electronic control system on the test bench;
   control means independent of the motor vehicle for controlling the means for generating and the means for applying to generate a selected one of the predetermined signals and for applying the generated signal to the electronic control system on the test bench;
   means for decoding and analyzing the signals output by the electronic control system as a result of the application of the stimulation signals;
   measuring means including elements selected from the group consisting of voltmeters, frequency meters and oscilloscopes, for detecting the signals output by the systems under test as a result of the application of the stimulation signals; and
   level-adjustment means which operate on at least one of the stimulation signals and on the signals output by the system under test as a result of the stimulation signals.

4. A system for bench testing an electronic control system for a motor vehicle in conjunction with a test bench, the system including:
   means independent of the motor vehicle for generating predetermined signals for stimulating the electronic control system under test;
   means independent of the motor vehicle for applying the predetermined stimulation signals to the electronic control system on the test bench;
   control means independent of the motor vehicle for controlling the means for generating and the means for applying to generate a selected one of the predetermined signals and for applying the generated signal to the electronic control system on the test bench;
   means for decoding and analyzing the signals output by the electronic control system as a result of the application of the stimulation signals;
   the system for use in testing control systems with respective associated actuators, the system further including probe means for detecting an electrical consumption of the actuators during the testing of the system.

5. A system according to claim 4, wherein the probe means comprise current probes.

6. A system for bench testing an electronic control system for a motor vehicle in conjunction with a test bench, the system including:
   means independent of the motor vehicle for generating predetermined signals for stimulating the electronic control system under test;
   means independent of the motor vehicle for applying the predetermined stimulation signals to the electronic control system on the test bench;
   control means independent of the motor vehicle for controlling the means for generating and the means for applying to generate a selected one of the predetermined signals and for applying the generated signal to the electronic control system on the test bench;
   means for decoding and analyzing the signals output by the electronic control system as a result of the application of the stimulation signals;
   measuring means including elements selected from the group consisting of voltmeters, frequency meters and oscilloscopes, for detecting the signals output by the systems under test as a result of the application of the stimulation signals; and
   a processing circuit which can control the means for generating stimulation signals and the decoding and analysing means to operate according to selectively-predetermined sequences;
   wherein the means for generating the stimulation signals comprise signal generators which have resident intelligence and which can generate stimulation signals in sequence autonomously as a result of initiating instructions received from the processing circuit so that, during testing, the processing circuit can operate primarily on the signals output by the system under test as a result of the application of the stimulation signals.

7. A system for bench testing an electronic control system for a motor vehicle in conjunction with a test bench, the system including:
   means independent of the motor vehicle for generating predetermined signals for stimulating the electronic control system under test;
   means independent of the motor vehicle for applying the predetermined stimulation signals to the electronic control system on the test bench;
   control means independent of the motor vehicle for controlling the means for generating and the means for applying to generate a selected one of the predetermined signals and for applying the generated signal to the electronic control system on the test bench;
   means for decoding and analyzing the signals output by the electronic control system as a result of the application of the stimulation signals;
   the system for use in conjunction with an air-conditioned cell for the application of selectively-determined environmental conditions to the system under test, the air-conditioned cell carrying respective associated air-conditioning means, the system further including means for operating the air-conditioning means in coordination with the means for generating the stimulation signals and the means for decoding and analysing the signals output by the system under test as a result of the application of the stimulation signals.

8. A system for bench testing an electronic control system for a motor vehicle in conjunction with a test bench, the system including:
   means independent of the motor vehicle for generating predetermined signals for stimulating the electronic control system under test;
   means independent of the motor vehicle for applying the predetermined stimulation signals to the electronic control system on the test bench;
   control means independent of the motor vehicle for controlling the means for generating and the means for applying to generate a selected one of the predetermined signals and for applying the generated signal to the electronic control system on the test bench;
   means for decoding and analyzing the signals output by the electronic control system as a result of the application of the stimulation signals;
   measuring means including elements selected from the group consisting of voltmeters, frequency meters and oscilloscopes, for detecting the signals output by the systems under test as a result of the application of the stimulation signals; and
   a recording module for storing at least one predetermined stimulation signal to be applied to the system being tested.

* * * * *